US007843269B2

(12) United States Patent  
Chen et al.

(10) Patent No.: US 7,843,269 B2  
(45) Date of Patent: Nov. 30, 2010

(54) CASCODE-CASCADE POWER AMPLIFIER ASSEMBLY

(75) Inventors: Yi-jan Emery Chen, Taipei (TW); Pang-Jung Liu, Taipei (TW)

(73) Assignee: National Taiwan University, Taipei (TW)

( * ) Notice: Subject to any disclaimer, the term of this patent is extended or adjusted under 35 U.S.C. 154(b) by 44 days.

(21) Appl. No.: 12/334,924

(22) Filed: Dec. 15, 2008

(65) Prior Publication Data

US 2009/0212870 A1 Aug. 27, 2009

(30) Foreign Application Priority Data

Feb. 21, 2008 (TW) ................ 97106013 A

(51) Int. Cl.  
*H03F 3/68* (2006.01)

(52) U.S. Cl. .................... 330/295; 330/124 R

(58) Field of Classification Search .......... 330/133, 330/295–296

See application file for complete search history.

(56) References Cited

U.S. PATENT DOCUMENTS 3,531,732 A * 9/1970 Thompson ............... 330/282

6,473,595 B1 * 10/2002 Kim et al. ................ 455/63.1

\* cited by examiner

*Primary Examiner*—Robert Pascal  
*Assistant Examiner*—Khiem D Nguyen  
(74) *Attorney, Agent, or Firm*—Peter F. Corless; Steven M. Jensen; Edwards Angell Palmer & Dodge LLP

(57) ABSTRACT

A cascode-cascade power amplifier assembly is provided. Which includes a first common-source amplifier, a second common-source amplifier, a phase shift matching network coupled to the first common-source amplifier and the second common-source amplifier for providing a 90-degree phase shift and allowing less than 50% of the output power of the first common-source amplifier to be transmitted to the second common-source amplifier, a common-gate amplifier which forms a series circuit arrangement with the first-common source amplifier and a parallel circuit arrangement with the second common-source amplifier, and an equivalent quarter-wave or three-quarter wave circuit which forms a series circuit arrangement with the common-gate amplifier and a parallel circuit arrangement with the second common-source amplifier. According to the present invention, the first common-source amplifier and the common-gate amplifier form a cascode main amplifier, while the first common-source amplifier and the second common-source amplifier form a cascade auxiliary amplifier.

16 Claims, 2 Drawing Sheets

CASCODE-CASCADE POWER AMPLIFIER ASSEMBLY

BACKGROUND OF THE INVENTION

1. Field of the Invention

This invention generally relates to power amplifiers, and more specifically, to a cascode-cascade power amplifier assembly.

2. Description of Related Art

Orthogonal frequency division multiplexing (OFDM) is commonly adopted by modern high-speed wireless communication systems in order to achieve the objective of high transmission data rate. However, the major drawbacks of the OFDM systems are the high peak-to-average power ratio (PAPR) and large dynamic range of the transmit signal due to the utilization of a multi-carrier modulation method. The power amplifier is found to achieve the maximum power efficiency while transmitting the peak power, and most of the power amplifiers, when operated in the back-off region, are much less power efficient. Unfortunately, the transmitted power of the OFDM signals is around the average power level most of the time. Therefore, the efficiency of the radio frequency (RF) power amplifier at low output power is a crucial issue for the applications with high peak-to-average power ratio.

The Doherty power amplifier is the power amplifier that can increase the power-added efficiency (PAE) at back-off region. FIG. 1 illustrates the functional block diagram of a conventional Doherty power amplifier 10. The Doherty power amplifier 10 consists of: a main amplifier 12, an auxiliary amplifier 14, a series (cascade) arrangement of a quarter-wave transmission line 16 and the main amplifier 12, and a series (cascade) arrangement of a three-quarter wave transmission line 18 and the auxiliary amplifier 14, wherein the main amplifier 12 is a class-AB power amplifier, while the auxiliary amplifier 14 is a class-C power amplifier. When the Doherty power amplifier 10 operates in low power level region, only the main amplifier 12 operates. When the Doherty power amplifier 10 operates in high power region, the main amplifier 12 saturates and the auxiliary amplifier 14 begins to operate. Through this mechanism and load modulation, the Doherty power amplifier 10 achieves high efficiency at power back-off region.

As shown in FIG. 1, the Doherty power amplifier 10 also has a power splitter 20 for distributing input power to the main amplifier 12 and the auxiliary amplifier 14. The power splitter 20 takes up a large area when implemented with an integrated circuit. Moreover, when the Doherty power amplifier 10 operates at low gigahertz (e.g. 2.4 GHZ), the physical dimensions of the quarter-wave transmission line 16 and 18 become unreasonably large on integrated-circuit chip. Therefore, it is inappropriate to implement the monolithic integrated conventional Doherty power amplifier 10.

SUMMARY OF THE INVENTION

In view of the disadvantages of the aforementioned prior art, the present invention provides a cascode-cascade Doherty power amplifier that has no need of a power splitter and thus is suitable for being implemented in integrated circuits.

To achieve the aforementioned and other objectives, the cascode-cascade Doherty power amplifier assembly of the present invention includes: a first common-source amplifier; a second common-source amplifier forming a cascade circuit arrangement with the first common-source amplifier; a phase shift matching network coupled between the first common-source amplifier and the second common-source amplifier for providing a 90-degree phase shift as well as limiting less than 50% of the output power of the first common-source amplifier to be transmitted to the second common-source amplifier; a common-gate amplifier forming a cascode circuit arrangement with the first-common source amplifier; and an equivalent quarter-wave or three-quarter wave circuit forming a series (cascade) circuit arrangement with the common-gate amplifier and a parallel circuit arrangement with the second common-source amplifier; wherein the first common-source amplifier and the common-gate amplifier form a cascode main amplifier of the cascode-cascade Doherty power amplifier assembly, while the first common-source amplifier and the second common-source amplifier form a cascade auxiliary amplifier of the cascode-cascade Doherty power amplifier assembly.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
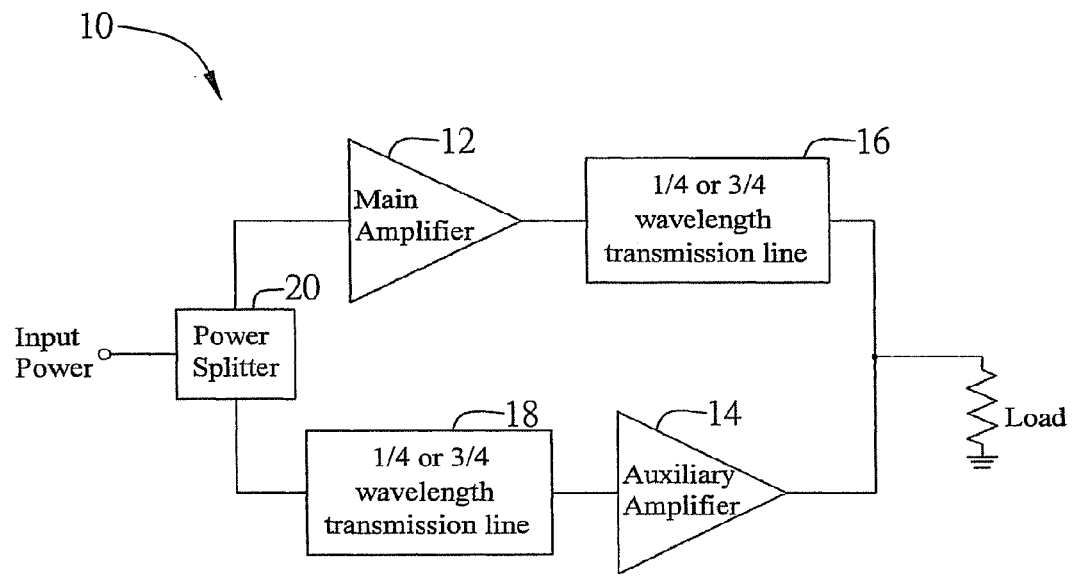
FIG. 1 is a functional block diagram of a conventional Doherty power amplifier assembly.
Figure 2:
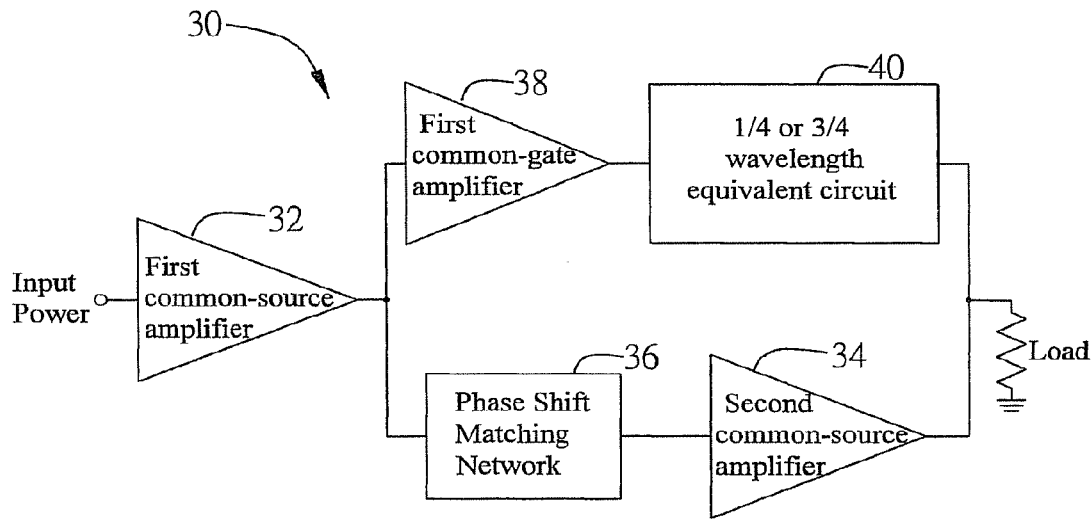
FIG. 2 is a functional block diagram of a preferred embodiment of the cascode-cascade Doherty power amplifier of the present invention.

FIG. 2, a functional block diagram of a preferred embodiment of the cascode-cascade Doherty power amplifier assembly 30 of the present invention, illustrates the cascode-cascade Doherty power amplifier assembly 30 having: a first common-source amplifier 32; a second common-source amplifier 34; a phase shift matching network 36 coupled between the first common-source amplifier 32 and the second common-source amplifier 34; a common-gate amplifier 38 forming a series circuit arrangement with the first common-source amplifier 32 and a parallel circuit arrangement with the second common-source amplifier 34, and an equivalent quarter-wave or three-quarter wave circuit 40 which forms a series circuit arrangement with the common-gate amplifier 38 and a parallel circuit arrangement with the second common-source amplifier 34. The first common-source amplifier 32 is for signal input. The phase shift matching network 36 provides a 90-degree phase shift and a high input impedance looking from the first common-source amplifier 32, thereby passing only less than 50% of the output power of the first common-source amplifier 32 to the second common-source amplifier 34, while most of the output power is transmitted to the common-gate amplifier 38. In the preferred embodiment of the present invention, the phase shift matching network 36 allows 10% of the output power from the first common-source amplifier 32 to be passed to the second common-source amplifier 34. In other words, the common-gate amplifier receives 90% of the output power. According to the cascode-cascade Doherty power amplifier assembly 30 of the present invention, the first common-source amplifier 32 and the common-gate amplifier 38 form a cascode main amplifier of the cascode-cascade Doherty power amplifier assembly 30, while the first common-source amplifier 32 and the second common-source amplifier 34 form a cascade auxiliary amplifier of the cascode-cascade Doherty power amplifier assembly 30.

Figure 3:
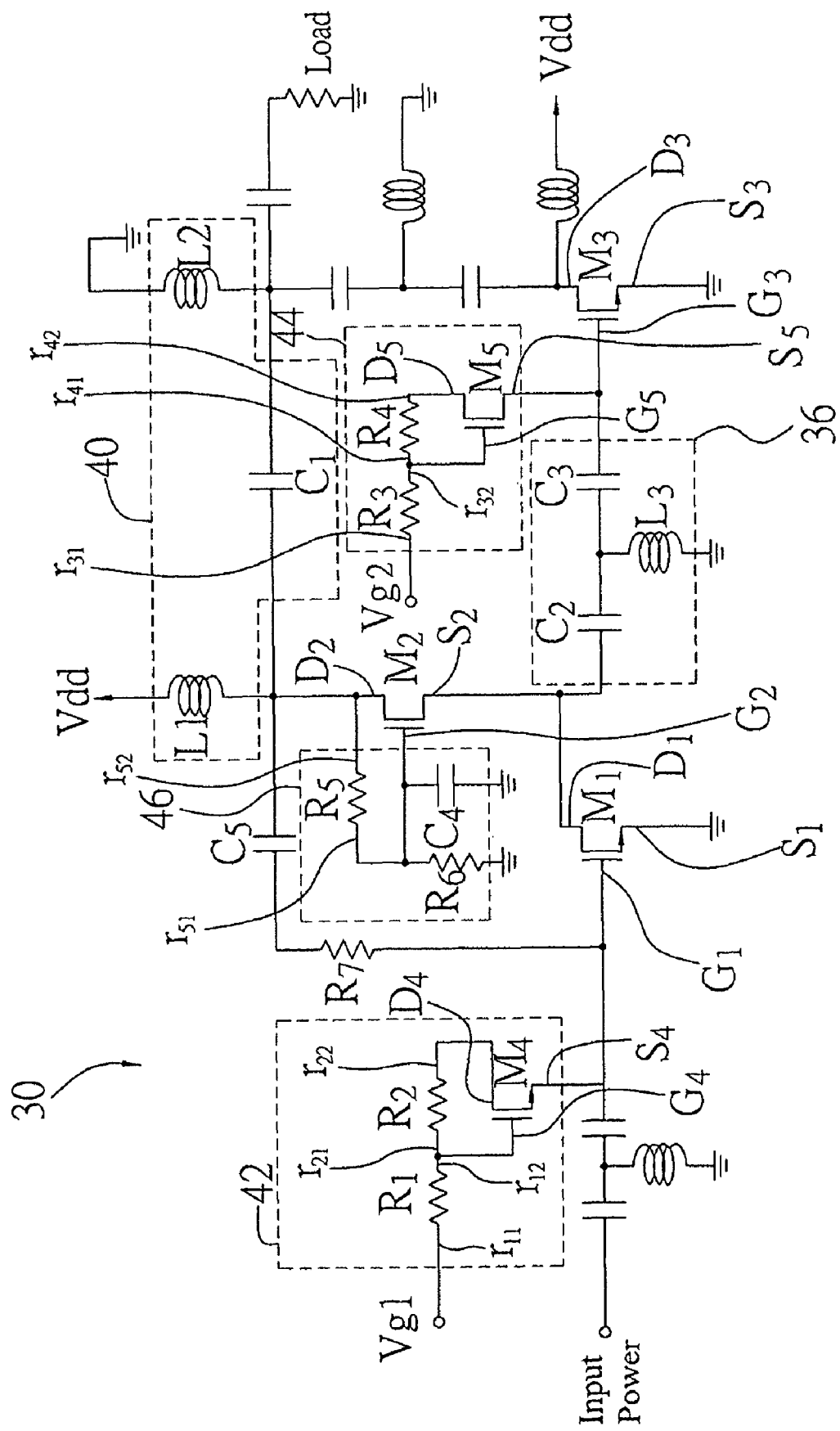
FIG. 3 is a circuit schematic of the cascode-cascade Doherty power amplifier assembly of FIG. 2.

Referring to FIG. 3, a circuit schematic of the cascode-cascade Doherty power amplifier assembly of FIG. 2 is illustrated. In the preferred embodiment of the present invention, the first common-source amplifier 32 includes a first transistor $M_1$ and a first bias voltage circuit 42 coupled to a first gate $G_1$ of the first transistor $M_1$ wherein a first source $S_1$ of the first transistor $M_1$ is grounded and the first bias voltage circuit 42 has a first resistor $R_1$, a second resistor $R_2$, and a fourth transistor $M_4$ with a first end $r_{11}$ of the first resistor $R_1$ receiving a first control bias voltage $V_{g1}$, a first end $r_{21}$ of the second resistor $R_2$ coupled to a second end $r_{12}$ of the first resistor $R_1$, a fourth gate $G_4$ of the fourth transistor $M_4$ coupled to the first end $r_{21}$ of the second resistor $R_2$, a fourth drain $D_4$ of the fourth transistor $M_4$ coupled to a second end $r_{22}$ of the second resistor $R_2$, and a fourth source $S_4$ coupled to the first gate $G_1$ of the first transistor $M_1$. Likewise, the second common-source amplifier 34 includes a third transistor $M_3$ and a second bias voltage circuit 44 coupled to a third gate $G_3$ of the transistor M3 wherein a third source $S_3$ of the third transistor $M_3$ is grounded and the second bias voltage circuit 44 has a third resistor $R_3$, a fourth resistor $R_4$, and a fifth transistor $M_5$ with a first end $r_{31}$ of the third resistor $R_3$ receiving second control bias voltage $V_{g2}$, a first end $r_{41}$ of the fourth resistor $R_4$ coupled to a second end $r_{32}$ of the third resistor $R_3$, a fifth gate $G_5$ of the fifth transistor $M_5$ coupled to the first end $r_{41}$ of the fourth resistor $R_4$, a fifth drain $D_5$ of the fifth transistor $M_5$ coupled to a second end $r_{42}$ of the fourth resistor $R_4$, and a fifth source $S_5$ of the fifth transistor $M_5$ coupled to the third gate $G_3$ of the third transistor $M_3$. The common-gate amplifier 38 includes a second transistor $M_2$ and a self-bias voltage circuit 46 coupled between a second gate $G_2$ and a second drain $D_2$ of the second transistor $M_2$. Further, a second source $S_2$ of the second transistor $M_2$ is coupled to a first drain $D_1$ of the first transistor $M_1$ and the self-bias voltage circuit 46 has a fifth resistor $R_5$, a sixth resistor $R_6$, and a fourth capacitor $C_4$ with a first end $r_{51}$ of the fifth resistor $R_5$ coupled to the second gate $G_2$ of the second transistor $M_2$, a second end $r_{52}$ of the fifth resistor $R_5$ coupled to the second drain $D_2$ of the second transistor $M_2$, the sixth resistor $R_6$ coupled between the first end $r_{51}$ of the fifth resistor $R_5$ and the ground, as well as the fourth capacitor $C_4$ coupled between the second gate $G_2$ of the second transistor $M_2$ and the ground.

Comparing to the conventional Doherty power amplifier assembly, the cascode-cascade Doherty power amplifier assembly of the present invention selects the quarter-wave transmission line 16 or the three-quarter wave transmission line 18 to be the equivalent quarter-wave or three-quarter wave circuit 40. However, in order to allow the cascode-cascade Doherty power amplifier assembly 30 to be integrated into a chip, according to the preferred embodiment of the present invention, the equivalent quarter-wave or three-quarter wave circuit 40 further includes a first inductor $L_1$, a second inductor $L_2$, and a first capacitor $C_1$, wherein the first inductor $L_1$ is coupled to the second drain $D_2$ of the second transistor $M_2$ of the common-gate amplifier 38, the second inductor $L_2$ is coupled to a third drain $D_3$ of the third transistor $M_3$ of the second common-source amplifier 34, and the first capacitor $C_1$ is coupled between the first inductor $L_1$ and the second inductor $L_2$.

Furthermore, in the preferred embodiment of the present invention, the phase shift matching network 36 comprises a second capacitor $C_2$, a third capacitor $C_3$, and a third inductor $L_3$, wherein the second capacitor $C_2$ is coupled to the first drain $D_1$ of the first transistor $M_1$ of the first common-source amplifier 32, the third capacitor $C_3$ is coupled between the second capacitor $C_2$ and the third gate $G_3$ of the third transistor $M_3$ of the second common-source amplifier 34, and the third inductor $L_3$ is coupled between the ground and the common node of the second capacitor $C_2$ and the third capacitor $C_3$.

In summary, according to the preferred embodiment of the present invention, the Doherty power amplifier assembly 30 includes a first common-source amplifier 32, a second common-source amplifier 34, a phase shift matching network 36, and an equivalent quarter-wave or three-quarter wave circuit 40, wherein the first common-source amplifier 32 and the common-gate amplifier 38 form a cascode main amplifier of the Doherty power amplifier assembly 30, while the first common-source amplifier 32 and the second common-source amplifier 34 form a cascade auxiliary amplifier of the Doherty power amplifier assembly 30. Accordingly, in other embodiments of the present invention, the Doherty power amplifier assembly 30 can be viewed as a cascode-cascade Doherty power amplifier assembly that has a cascode main amplifier module and a cascade auxiliary amplifier module, wherein the cascode main amplifier module serves to receive input signals; the cascode main amplifier module and the cascade auxiliary amplifier module share the first common-source amplifier 32. In addition, the cascade auxiliary amplifier module also includes the second common-source amplifier 34 and the phase shift matching network 36, while the cascode main amplifier module also has the common-gate amplifier 38 as well as the equivalent quarter-wave or three-quarter wave circuit 40.

Compared with the conventional Doherty power amplifier assembly 10, the Doherty power amplifier assembly 30 of the present invention does not require the power splitter 20, thereby taking up a circuit area far smaller than the conventional Doherty power amplifier assembly 10 and being favorable of integration. In addition, the Doherty power amplifier assembly 30 of the present invention replaces the quarter-wave or three-quarter wave circuit of the conventional Doherty power amplifier assembly 10 with the equivalent quarter-wave or three-quarter wave circuit 40 having the first inductor L1, the second inductor L2 and the first capacitor C1, therefore the size of the Doherty power amplifier assembly 30 of the present invention has been further reduced which makes it easier to integrate the Doherty power amplifier assembly 30 onto integrated circuits.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:
1. A cascode-cascade Doherty power amplifier assembly, comprising:
a first common-source amplifier for receiving input signals;
a second common-source amplifier;

a phase shift matching network coupled between the first common-source amplifier and the second common-source amplifier, allowing less than 50% of an output power of the first common-source amplifier to be transmitted to the second common-source amplifier;

a common-gate amplifier for forming a series circuit arrangement with the first common-source amplifier and a parallel circuit arrangement with the second common-source amplifier, allowing the rest of the output power to be delivered to the common-gate amplifier; and an equivalent quarter-wave or three-quarter wave circuit for forming a series circuit arrangement with the common-gate amplifier and a parallel circuit arrangement with the second common-source amplifier;

wherein the first common-source amplifier and the common-gate amplifier form a cascode main amplifier of the cascode-cascade Doherty power amplifier and the first common-source amplifier and the second common-source amplifier form a cascade auxiliary amplifier of the cascode-cascade Doherty power amplifier.

2. The cascode-cascade Doherty power amplifier assembly of claim 1, wherein the equivalent quarter-wave circuit is a quarter-wave transmission line, and the equivalent three-quarter wave circuit is a three-quarter wave transmission line.

3. The cascode-cascade Doherty power amplifier assembly of claim 1, wherein the equivalent quarter-wave or three-quarter wave circuit comprises:
a first inductor coupled to the common-gate amplifier;
a second inductor coupled to the second common-source amplifier; and
a first capacitor coupled between the first inductor and the second inductor.

4. The cascode-cascade Doherty power amplifier assembly of claim 1, wherein the phase shift matching network comprises:
a second capacitor coupled to the first common-source amplifier;
a third capacitor coupled between the second capacitor and the second common-source amplifier; and
a third inductor coupled to the second capacitor and the third capacitor.

5. The cascode-cascade Doherty power amplifier assembly of claim 1, wherein the first common-source amplifier comprises a first transistor and a first bias voltage circuit coupled to a first gate of the first transistor, the common-gate amplifier comprises a second transistor and a self-bias voltage circuit coupled between a second gate and a second drain of the second transistor, the second common-source amplifier comprises a third transistor and a second bias voltage circuit coupled to a third gate of the third transistor, and a second source of the second transistor is coupled to a first drain of the first transistor, while a first source of the first transistor and a third source of the third transistor are grounded.

6. The cascode-cascade Doherty power amplifier assembly of claim 5, wherein the first bias voltage circuit comprises:
a first resistor having a first end for receiving a first control voltage;
a second resistor having a first end coupled to a second end of the first resistor; and
a fourth transistor having a fourth gate coupled to the first end of the second resistor, a fourth drain coupled to a second end of the second resistor, and a fourth source coupled to the first gate of the first transistor.

7. The cascode-cascade Doherty power amplifier assembly of claim 5, wherein the second bias voltage circuit comprises:
a third resistor having a first end for receiving a second control voltage;

a fourth resistor having a first end coupled to a second end of the third resistor; and
a fifth transistor having a fifth gate coupled to the first end of the fourth resistor, a fifth drain coupled to a second end of the fourth resistor, and a fifth source coupled to the third gate of the third transistor.

8. The cascode-cascade Doherty power amplifier assembly of claim 5, wherein the self-bias voltage circuit comprises:
a fifth resistor having a first end coupled to the second gate of the second transistor; and a second end coupled to the second drain of the second transistor;
a sixth resistor coupled between the first end of the fifth resistor and the ground; and
a fourth capacitor coupled between the second gate of the second transistor and the ground.

9. A cascode-cascade Doherty power amplifier assembly, comprising:
a cascode main amplifier module for receiving input signals; and
a cascade auxiliary amplifier module coupled to the cascode main amplifier module;
wherein the cascode main amplifier module and the cascade auxiliary amplifier module share a first common-source amplifier,
the cascade auxiliary amplifier module comprises:
the first common-source amplifier for receiving the input signals;
a second common-source amplifier; and
a phase shift matching network coupled between the first common-source amplifier and the second common-source amplifier, the phase shift matching network being configured to provide a 90-degree phase shift and allow less than 50% of output power of the first common-source amplifier to be transmitted to the second common-source amplifier, and
the cascode main amplifier module comprises:
the first common-source amplifier;
a common-gate amplifier for forming a series circuit arrangement with the first common-source amplifier and a parallel circuit arrangement with the second common-source amplifier; and
an equivalent quarter-wave or three-quarter wave circuit which forms a series circuit arrangement with the common-gate amplifier and a parallel circuit arrangement with the second common-source amplifier.

10. The cascode-cascade Doherty power amplifier assembly of claim 9, wherein the equivalent quarter-wave circuit is a quarter-wave transmission line, or a three-quarter wave transmission line.

11. The cascode-cascade Doherty power amplifier assembly of claim 9, wherein the equivalent quarter-wave or three-quarter wave circuit comprises:
a first inductor coupled to the common-gate amplifier;
a second inductor coupled to the second common-source amplifier; and
a first capacitor coupled between the first inductor and the second inductor.

12. The cascode-cascade Doherty power amplifier assembly of claim 9, wherein the phase shift matching network comprises:
a second capacitor coupled to the first common-source amplifier;
a third capacitor coupled between the second capacitor and the second common-source amplifier; and
a third inductor coupled to the second capacitor and the third capacitor.

13. The cascode-cascade Doherty power amplifier assembly of claim 9, wherein the first common-source amplifier comprises a first transistor and a first bias voltage circuit coupled to a first gate of the first transistor, the common-gate amplifier comprises a second transistor and a self-bias voltage circuit coupled between a second gate and a second drain of the second transistor, and the second common-source amplifier comprises a third transistor and a second bias voltage circuit coupled to a third gate of the third transistor, wherein a second source of the second transistor is coupled to a first drain of the first transistor, while a first source of the first transistor and a third source of the third transistor are grounded.

14. The cascode-cascade Doherty power amplifier assembly of claim 13, wherein the first bias voltage circuit comprises:
- a first resistor having a first end for receiving a first control voltage;
- a second resistor having a first end coupled to a second end of the first resistor; and
- a fourth transistor having a fourth gate coupled to the first end of the second resistor, a fourth drain coupled to a second end of the second resistor, and a fourth source coupled to the first gate of the first transistor.

15. The cascode-cascade Doherty power amplifier assembly of claim 13, wherein the second bias voltage circuit comprises:
- a third resistor having a first end for receiving a second control voltage;
- a fourth resistor having a first end coupled to a second end of the third resistor; and
- a fifth transistor having a fifth gate coupled to the first end of the fourth resistor, a fifth drain coupled to a second end of the fourth resistor and a fifth source coupled to the third gate of the third transistor.

16. The cascode-cascade Doherty power amplifier assembly of claim 13, wherein the self-bias voltage circuit comprises:
- a fifth resistor having a first end coupled to the second gate of the second transistor, and a second end coupled to the second drain of the second transistor;
- a sixth resistor coupled between the first end of the fifth resistor and the ground; and
- a fourth capacitor coupled between the second gate of the second transistor and the ground.

* * * * *